United States Patent
Liu et al.

(10) Patent No.: US 11,677,499 B2
(45) Date of Patent: Jun. 13, 2023

(54) TONE INTERLEAVING METHODS FOR MULTI-BANDS AND WIDE BANDWIDTH TRANSMISSIONS IN WLAN

(71) Applicant: MediaTek Singapore Pte. Ltd., Solaris (SG)

(72) Inventors: Jianhan Liu, San Jose, CA (US); Shengquan Hu, San Jose, CA (US)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 237 days.

(21) Appl. No.: 16/586,192

(22) Filed: Sep. 27, 2019

(65) Prior Publication Data

US 2020/0136756 A1   Apr. 30, 2020

Related U.S. Application Data

(60) Provisional application No. 62/750,286, filed on Oct. 25, 2018.

(51) Int. Cl.
| | |
|---|---|
| *H04L 1/00* | (2006.01) |
| *H03M 13/25* | (2006.01) |
| *H03M 13/27* | (2006.01) |
| *H04L 5/00* | (2006.01) |
| *H04W 72/0453* | (2023.01) |
| *H04W 84/12* | (2009.01) |

(52) U.S. Cl.
CPC ........ *H04L 1/0063* (2013.01); *H03M 13/255* (2013.01); *H03M 13/276* (2013.01); *H04L 1/0071* (2013.01); *H04L 5/0048* (2013.01); *H04W 72/0453* (2013.01); *H04W 84/12* (2013.01)

(58) Field of Classification Search
CPC ... H04L 1/0063; H04L 1/0071; H04L 5/0048; H03M 13/255; H03M 13/276; H04W 72/0453; H04W 84/12
See application file for complete search history.

(56) References Cited

U.S. PATENT DOCUMENTS

| | | | |
|---|---|---|---|
| 7,269,209 B2 * | 9/2007 | Peeters | H04L 5/0046 375/222 |
| 2003/0152155 A1 | 8/2003 | Peeters | |
| 2013/0301555 A1 | 11/2013 | Porat | |
| 2015/0365195 A1 | 12/2015 | Yang et al. | |

(Continued)

FOREIGN PATENT DOCUMENTS

| | | |
|---|---|---|
| CN | 106713213 A | 5/2017 |
| WO | 2014/063462 A1 | 5/2014 |
| WO | 2018/226411 A1 | 12/2018 |

*Primary Examiner* — Rhonda L Murphy

(57) ABSTRACT

Embodiments of the present invention provide a method and apparatus for tone interleaving wide channel bandwidths or transmissions using multiple-bands. Embodiments of the present invention are designed to accommodate new generations of WLAN. According to some embodiments, existing communication standards of the current generations of WLAN are used to simplify the implementation of the tone mapping schemes described herein. For example, some embodiments of the present invention use an 80 MHz channel bandwidth with resource units having 996 tones as a building block to efficiently implement new tone mapping and interleaving schemes for wider bandwidth channels.

7 Claims, 12 Drawing Sheets

(56) References Cited

U.S. PATENT DOCUMENTS

| | | | |
|---|---|---|---|
| 2016/0007354 A1* | 1/2016 | Chen | H04L 1/0063 |
| | | | 370/329 |
| 2017/0134050 A1 | 5/2017 | Abu-Surra et al. | |
| 2017/0346667 A1* | 11/2017 | Wang | H04L 27/2057 |
| 2019/0281614 A1* | 9/2019 | Chen | H04L 5/0007 |
| 2021/0045151 A1* | 2/2021 | Chen | H04L 69/22 |
| 2021/0344540 A1* | 11/2021 | Park | H04L 27/2603 |

\* cited by examiner

100

| Channel BW (MHz) | Ru size | Number of data tones |
|---|---|---|
| 20 | 242 | 234 |
| 40 | 482 | 468 |
| 80 | 996 | 980 |
| 160 or 80+80 | 2*996=1992 | 2*980=1960 |

| Channel BW (MHz) | Aggregated tones | Number of data tones |
|---|---|---|
| 240 or 80+160 or 80+80+80 | 3*996=2988 | 3*980=2940 |
| 320 or 160+160 or 80+240 or 80+80+160 or 80+80+80+80 | 4*996=3984 | 4*980=3920 |

LDPC tone mapping distance for each RU size

11ax

| Parameter | RU Size (tones) | | | | | | |
|---|---|---|---|---|---|---|---|
| | 26 | 52 | 106 | 242 | 484 | 996 | 2×996 |
| $D_{TM}$ | 1 | 3 | 6 | 9 | 12 | 20 | 20 |

450

LDPC tone mapping distance for each bandwidth

11ac

| Parameter | 20 MHz | 40 MHz | 80 MHz | 160 MHz, 80+80 MHz |
|---|---|---|---|---|
| $D_{TM}$ | 4 | 6 | 9 | 9 |

| Channel BW (MHz) | Dtm |
|---|---|
| 240 or 80+160 or 80+80+80 | 20 |
| 320 or 160+160 or 80+240 or 80+80+160 or 80+80+80+80 | 20 |

| Channel BW (MHz) | Number of data tones | Possible Dtm |
|---|---|---|
| 240 | 3*980=2940 | 20, 49, 60, 140 |
| 320 | 4*980=3920 | 20,40,49,80,140 |

FIG. 8

TONE INTERLEAVING METHODS FOR MULTI-BANDS AND WIDE BANDWIDTH TRANSMISSIONS IN WLAN

CROSS-REFERENCE TO RELATED APPLICATIONS

This application claims the benefit of and priority to provisional patent application Ser. No. 62/750,286, with a filing date of Oct. 25, 2018, which is hereby incorporated by reference in its entirety.

FIELD

Embodiments of the present invention generally relate to the field of wireless communications. More specifically, embodiments of the present invention relate to tone mapping plans for wide bandwidth, e.g., 240 MHz or 320 MHz, channels.

BACKGROUND

Existing approaches to WLAN wireless communication involve interleaved tone plans used to map complex constellation points of codewords to nonadjacent addresses or index values. Interleaving the codeword mapping is important to reduce the error rate of wireless transmissions, for example, caused by burst errors. This type of mapping in effect spreads the data out over frequencies to make channel errors more correctable via error correction algorithms. Existing tone plans typically define resource units including a number of data tones ($N_{SD}$) that can be assigned to specific users/clients. The size of the channel's resource units depends on the channel's bandwidth and tone spacing. The bands currently available for 5 GHz transmissions are 20 MHz, 40 MHz, 80 MHz, and 160 MHz. Typically narrower channel bandwidths can support a greater number of users/clients, where wider channel bandwidths can provide greater throughput.

Recently, a new generation of wireless standards has been proposed that utilizes wider channel bandwidths or transmissions using multiple bands. Moreover, 6 GHz bands will be made available in the near future and will be used to implemented WLAN wireless communication. However, existing approaches to tone interleaving cannot take advantage of the wider channel bandwidths and therefore throughput is reduced.

Therefore, what is needed is an efficient approach to interleaving tones for WLAN wireless communication that utilizes multiple bands and wider channel bandwidths to provide enhanced throughput while mitigating the effects of burst errors.

SUMMARY

Accordingly, embodiments of the present invention provide a method and apparatus for tone interleaving wide channel bandwidths or transmissions using multiple-bands. Embodiments of the present invention are designed to accommodate new generations of WLAN. According to some embodiments, existing communication standards of the current generations of WLAN are used to simplify the implementation of the tone mapping schemes described herein. For example, some embodiments of the present invention use an 80 MHz channel bandwidth with resource units having 996 tones as a building block to efficiently implement new tone mapping and interleaving schemes for wider bandwidth channels. The tone interleaving methods described herein provide enhanced throughput for wider bandwidth channels (e.g., 240 MHz or 320 MHz) while mitigating the effects of burst errors.

According to one embodiment, a method of tone mapping for WLAN transmissions is disclosed. The method includes dividing a wireless channel into a plurality of subcarriers, the wireless channel includes a wireless bandwidth of 320 MHz, the wireless channel is operable to carry WLAN transmissions including codewords, and the codewords include a plurality of complex constellation points, mapping each complex constellation point of the codewords of the WLAN transmissions to tones of subcarriers of the plurality of subcarriers, consecutive complex constellation points of codewords are mapped to nonadjacent tones of a respective subcarrier by a) mapping a first complex constellation point of the codewords to a first value of a first subcarrier of the plurality of subcarriers, b) mapping a second complex constellation point of the codewords to a second value of a second subcarrier of the plurality of subcarriers, c) mapping a third complex constellation point of the codewords to a third value of a third subcarrier of the plurality of subcarriers, d) mapping a fourth complex constellation point of the codewords to a fourth value of a fourth subcarrier of the plurality of subcarriers, and e) repeating steps a)-d) until all tones of the subcarriers have been mapped.

According to some embodiments, the mapping includes mapping each complex constellation point using a tone mapping distance parameter of 20.

According to some embodiments, the subcarriers include a channel bandwidth of 80 MHz.

According to some embodiments, the subcarriers include 980 data tones.

According to some embodiments, the mapping reduces an error rate of the transmission caused by burst errors.

According to another embodiment, a method of tone mapping for WLAN transmissions is disclosed. The method include dividing a wireless channel into a plurality of subcarriers, the wireless channel includes a wireless bandwidth of 240 MHz, the wireless channel is operable to carry WLAN transmissions including codewords, and the codewords include a plurality of complex constellation points, mapping each complex constellation point of the codewords of the WLAN transmissions to tones of subcarriers of the plurality of subcarriers, consecutive complex constellation points of codewords are mapped to nonadjacent tones of a respective subcarrier by a) mapping a first complex constellation point of the codewords to a first value of a first subcarrier of the plurality of subcarriers, b) mapping a second complex constellation point of the codewords to a second value of a second subcarrier of the plurality of subcarriers, c) mapping a third complex constellation point of the codewords to a third value of a third subcarrier of the plurality of subcarriers, and d) repeating steps a)-c) until all tones of the subcarriers have been mapped.

According to some embodiments, the mapping includes mapping each complex constellation point using a tone mapping distance parameter of 20.

According to some embodiments the subcarriers include a channel bandwidth of 80 MHz.

According to some embodiments the subcarriers include 980 data tones.

According to some embodiments the method is performed by a wireless access point.

According to some embodiments the method is performed by a wireless station.

According to some embodiments, the method includes transmitting the WLAN transmissions using the tones mapped to the complex constellation points.

According to a different embodiment, a method of tone mapping for WLAN transmissions is disclosed. The method includes determining a wireless channel bandwidth of a wireless channel, the wireless channel is operable to carry WLAN transmissions including codewords, the codewords include a plurality of complex constellation points, dividing the wireless channel into a plurality of subcarriers, and mapping each complex constellation point of the codewords of the WLAN transmissions to tones of subcarriers of the plurality of subcarriers, consecutive complex constellation points of codewords are mapped to nonadjacent tones of a respective subcarrier until all tones of the respective subcarrier have been mapped.

According to some embodiments, the mapping includes mapping each complex constellation point using a tone mapping distance parameter of 20.

According to some embodiments, the subcarriers include a channel bandwidth of 80 MHz.

According to some embodiments, the wireless channel bandwidth equals 240 MHz and the plurality of subcarriers includes three subcarriers.

According to some embodiments, the wireless channel bandwidth equals 320 MHz and the plurality of subcarriers includes four subcarriers.

According to some embodiments, the subcarriers include 980 data tones.

According to some embodiments, the mapping reduces an error rate of the transmission caused by burst errors.

According to some embodiments, the method includes transmitting the WLAN transmissions using the tones mapped to the complex constellation points.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a table depicting resource unit sizes and data tones available for different channel bandwidths used by the IEEE 802.11ax standard.

FIG. 3 is table illustrating exemplary resource unit specifications for wider channel bandwidths of 240 MHz (240 MHz, 80+160 MHz, and 80+80+80 MHz) or 320 MHz (160+160 MHz, 80+240 MHz, 80+80+160 MHz, or 80+80+80+80 MHz) according to embodiments of the present invention.

FIG. 4 depicts tables of tone mapping distance parameters ($D_{TM}$) based on resource unit size for the IEEE 802.11ax standard and based on bandwidth for the IEEE 802.11ac standard.

FIG. 5 illustrates an exemplary tone interleaving scheme that builds on existing tone interleaving schemes depicted in tables 400 and 450 of FIG. 4 to implement tone interleaving for wider channel bandwidths available in new generations of WLAN wireless communication standards according to embodiments of the present invention.

FIG. 8 illustrates an exemplary tone interleaving scheme using a direct interleaver according to embodiments of the present invention.

DETAILED DESCRIPTION

Figure 2:
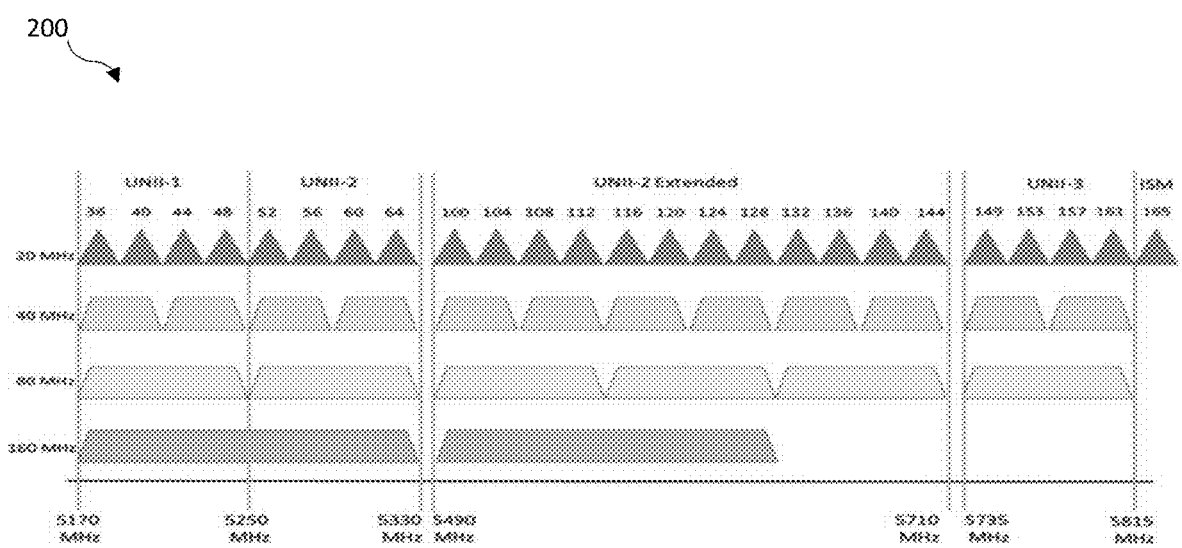
FIG. 2 is a chart illustrating bands used for wireless transmission in IEEE 802.11ax for 5 GHz transmissions.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follow are presented and discussed in terms of a method. Although steps and sequencing thereof are disclosed in a figure herein (e.g., FIGS. 9 and 10) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Tone Interleaving Methods for Multi-Bands and Wide Bandwidth Transmissions in WLAN Embodiments of the present invention provide a method and apparatus for tone interleaving wide channel bandwidths or transmissions using multiple-bands. Embodiments of the present invention are designed to accommodate new generations of WLAN. According to some embodiments, existing communication standards of the current generations of WLAN (e.g., IEEE 802.11ax) are used to simplify the implementation of the tone mapping schemes described herein. For example, some embodiments of the present invention use an 80 MHz channel bandwidth with resource units having 996 tones as a building block to efficiently implement new tone mapping and interleaving schemes for wider bandwidth channels.

As depicted in FIG. 1, existing tone plans typically define resource units including a number of data tones ($N_{SD}$) that can be assigned to specific users/clients. The size of the channel's resource units depends on the channel's bandwidth and tone spacing. The bands currently available for 5 GHz transmissions are 20 MHz, 40 MHz, 80 MHz, and 160 MHz. For example, as depicted in table 100 of FIG. 1, a 20 MHz channel has resource units with 242 total tones, including 234 data tones operable to be mapped to complex constellation points or complex constellation numbers of codewords to be transmitted. Other channel bandwidths, such as 40 MHz and 80 MHz channels, provide resource units having 482 and 996 tones, respectively. The IEEE 802.11ax also supports channel bandwidths of 160 MHz (or 80+80 MHz) which include resource units having 1992 tones including 1960 data tones.

Chart 200 depicted in FIG. 2 illustrates bands used for wireless transmission according to the IEEE 802.11ax standard for 5 GHz transmissions. The bands available for 5 GHz transmissions are 20 MHz, 40 MHz, 80 MHz, and 160 MHz. As depicted in chart 200, narrower channel bandwidths can support a greater number of users/clients, where wider channel bandwidths can provide greater throughput.

With regard to FIG. 3, table 300 illustrates exemplary resource unit specifications for wider channel bandwidths of 240 MHz (240 MHz, 80+160 MHz, and 80+80+80 MHz) or 320 MHz (160+160 MHz, 80+240 MHz, 80+80+160 MHz, or 80+80+80+80 MHz) according to embodiments of the present invention. Existing 80 MHz channel bandwidth specifications of IEEE 802.11ax with are used as a building block to efficiently implement the tone plan described in table 300. The specification defines resource units having 996 tones including 980 data tones. For example, the 240 MHz channel bandwidth provides 2988 (3×996) tones including 2940 data tones (3×980). The 320 MHz channel bandwidth provides 3984 (4×996) tones including 3920 data tones (4×980). The transmission can be interleaved over 160 MHz/80+80 MHz tone interleavers, and for each 160 MHz tone interleaver, a distance parameter 20 is applied. By reusing the 80 MHz channel bandwidth tone plan defined in existing WLAN specifications, the implementation of the enhanced tone planes described herein is simplified and less expensive to implement.

With regard to FIG. 4, tables 400 and 450 including tone mapping distance parameters ($D_{TM}$) based on resource unit size for IEEE 802.11ax, and based on bandwidth for IEEE 802.11ac implementations are depicted. Table 400 illustrates LDPC tone mapping distance parameters for different resource unit sizes according to IEEE 802.11ax. By spacing consecutive complex constellation points apart using a tone mapping distance parameter $D_{TM}$ in a tone interleaving scheme, the error rate of the wireless transmission is reduced. For example, as depicted in FIG. 4, resource units of 996 tones, e.g., a 80 MHz channel bandwidth, have a tone mapping distance parameter of 20, e.g., 20 tones according to a data tone index. Resource units of 2×996 tones, e.g., a 160 MHz channel bandwidth, also have a tone mapping distance parameter of 20. Smaller resource unit sizes use smaller mapping distance parameters. For example, resource units of 482, e.g., a 40 MHz bandwidth, use a mapping distance parameter of 12, and resource units of 242, e.g., a 20 MHz bandwidth, use a mapping distance parameter of 9.

LDPC tone mapping for IEEE 802.11ac is determined according to channel bandwidth. As depicted in table 450, a 20 MHz channel uses a tone mapping distance parameter of 4, a 40 MHz channel uses a tone mapping distance parameter of 6, an 80 MHz channel uses a tone mapping parameter of 9, and a 160 MHz or 80+80 MHz channel also uses a tone mapping distance parameter of 9.

Table 500 of FIG. 5 illustrates an exemplary tone interleaving scheme that builds on the existing tone interleaving schemes depicted in tables 400 and 450 of FIG. 4 to implement tone interleaving for wider channel bandwidths available in new generations of WLAN wireless communication standards according to embodiments of the present invention. As depicted in table 500, a 240 MHz channel (240 MHz, 80+160 MHz, or 80+80+80 MHz) uses a tone interleaving scheme with a tone mapping distance parameter of 20, e.g., according to a data tone index. Specifically, transmissions over non-contiguous frequency segments use a tone mapping distance parameter of 20 for each 80 MHz segment.

Figure 6:
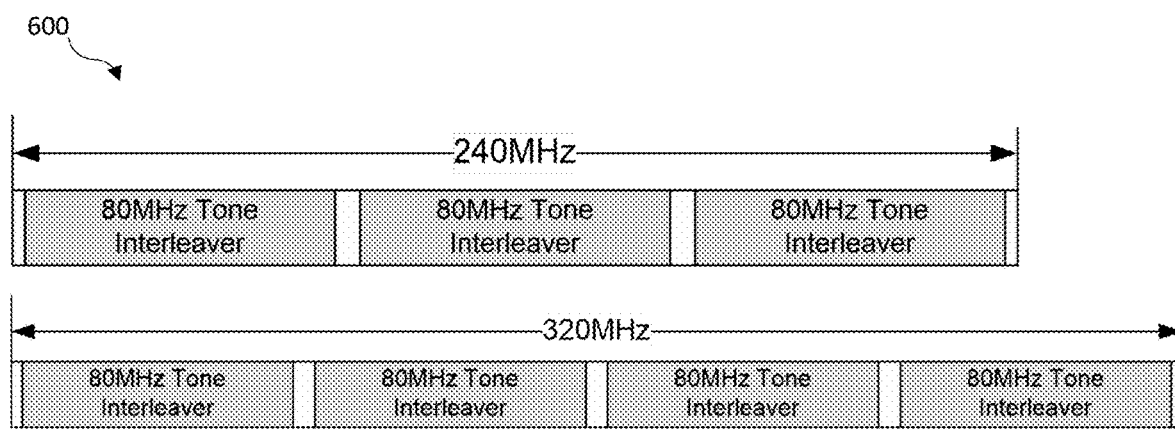
FIG. 6 depicts an exemplary tone interleaving scheme that defines a 240 MHz bandwidth channel with three non-contiguous 80 MHz frequency and a 320 MHz bandwidth channel with four non-contiguous 80 MHz frequency segments according to embodiments of the present invention.

As depicted in table 600 of FIG. 6, according to embodiments of the present invention, an exemplary tone interleaving scheme defines a 240 MHz bandwidth channel with three non-contiguous 80 MHz frequency segments including segment boundaries between each 80 MHz frequency segment. A 320 MHz bandwidth channel with four non-contiguous 80 MHz frequency segments is defined and includes segment boundaries between each 80 MHz frequency segment. The segment boundaries represent roughly 6-8% of the available data tones in accordance with existing tone mapping schemes of IEEE 802.11ax. No interleaving is performed over the segment boundaries. In other words, each frequency segment is tone mapped individually and there is no cross-over between the mappings of the frequency segments. Using segment boundaries between the frequency segments has the advantage of increasing tolerance to errors, e.g., burst errors, but may reduce overall throughput. By dividing each channel into 80 MHz channel segments with resource unit spacing of 20 as defined in existing WLAN specifications, the implementation of the enhanced tone planes described herein is simplified and less expensive to implement.

Figure 7A:
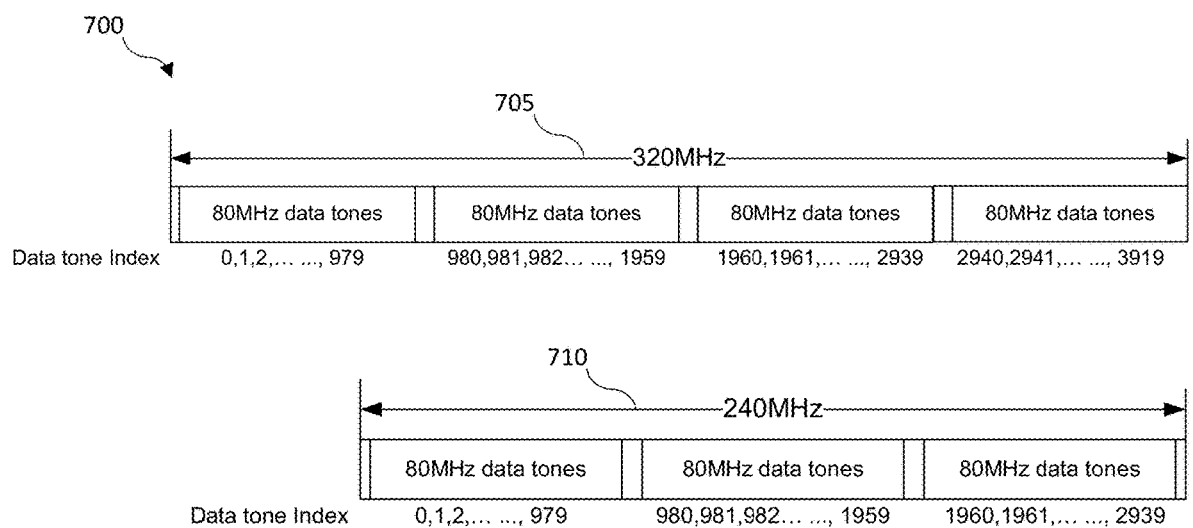
FIG. 7A illustrates an exemplary tone interleaving scheme using a two-level tone interleaver according to embodiments of the present invention.

FIG. 7A illustrates an exemplary tone interleaving scheme 700 using a two-level tone interleaver according to embodiments of the present invention. Similar to the tone mapping scheme depicted in FIG. 6, 240 MHz and 320 MHz bandwidth channels are segmented into 80 MHz bandwidth channel segments such that existing WLAN specifications can be reused, thereby simplifying the implementation of the tone interleaving scheme. Each 80 MHz channel segment includes 996 total tones with 980 data units representing codewords as defined in IEEE 802.11ax. In the tone interleaving scheme depicted in FIG. 7A, the tones are mapped across subcarriers (frequency segments) using a two level interleaver.

For example, a 320 MHz bandwidth channel 705 is divided into four frequency segments. Tones of each frequency segment are interleaved within a frequency segment in a first level of the interleaver, and the tones are further interleaved over each of the four frequency segments in a second level of the interleaver. According to some embodiments, the tones are interleaved over the four 80 MHz subcarriers as 4n for the first subcarrier, 4n+1 for the second sub carrier, 4n+2 for the third subcarrier, and 4n+3 for the fourth subcarrier, where n=0, 1, 2, . . . , 979, so that complex constellation points are mapped to 980 individual tones of each subcarrier. For each complex constellation point, an address/index value within the respective subcarrier is selected, and the tones are mapped in a non-linear manner for each subcarrier. The interleaving scheme 700 can use the same tone mapping distance parameter as IEEE 802.11ax, e.g., 20.

According to the tone interleaving scheme 700 depicted in FIG. 7A, a 240 MHz bandwidth channel 710 divided into three frequency segments. Tones of each frequency segment are interleaved within a frequency segment in a first level of the interleaver, and the tones are further interleaved over each of the three frequency segments in a second level of the interleaver. According to some embodiments, the tones are interleaved over the three 80 MHz subcarriers as 3n for the first subcarrier, 3n+1 for the second sub carrier, and 3n+2 for the third subcarrier, where n=0, 1, 2, . . . , 979, so that complex constellation points are mapped to 980 individual addresses/index values of each subcarrier. For each complex constellation point, an address within the respective subcarrier is selected, and the tones are mapped in a non-linear manner for each subcarrier.

Figure 7B:
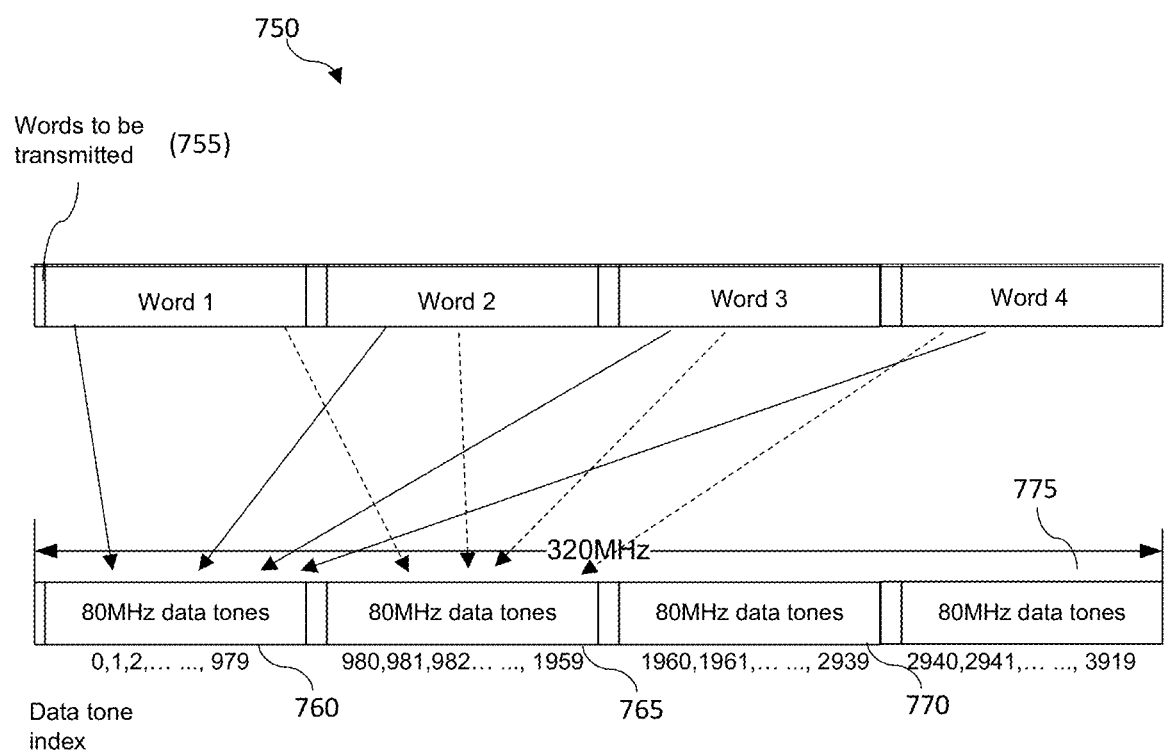
FIG. 7B illustrates the tone mapping steps of an exemplary tone interleaving scheme according to embodiments of the present invention.

FIG. 7B illustrates the tone mapping 750 of exemplary tone interleaving scheme 700 according to embodiments of the present invention. As depicted in FIG. 7B, a first step of the tone interleaving scheme 700 maps complex constellation points of words to be transmitted 755 including Word 1, Word 2, Word 3, and Word 4. These can be stored in memory. Each word includes a number of complex constellation points to be mapped to tones within the 320 MHz bandwidth channel for transmission. In a first step represented by the solid arrows in FIG. 7B, a first set of complex constellation point from Word 1, Word 2, Word 3, and Word 4 are mapped to tones in subcarrier 760. In a second step represented by the dashed arrows in FIG. 7B, a second set of complex constellation point from Word 1, Word 2, Word 3, and Word 4 are mapped to tones in subcarrier 765. Sets of other complex constellation points from the words to be transmitted 755 are mapped to tones in subcarrier 770 and 775 in the same manner. These steps are repeated until the 980 tones of each subcarrier have been mapped to complex constellation points of words to be transmitted 755.

FIG. 8 illustrates an exemplary tone interleaving scheme 800 using a direct interleaver according to embodiments of the present invention. Rather than segmenting each channel into 80 MHz subcarriers to reuse existing IEEE 802.11ax interleaving standards, the interleaving can be performed within the 240 MHz and 320 MHz bandwidths directly. The 240 MHz and 320 MHz can use different tone mapping distance parameters $D_{TM}$ to perform direct interleaving. As depicted in FIG. 8, for a 240 MHz bandwidth channel having 2940 (3×980) data tones, possible tone mapping distance parameters of 20, 49, 60, and 140 can be used to perform direct tone interleaving within the 240 MHz bandwidth channel. For a 320 MHz bandwidth channel having 3920 (4×980) data tones, possible tone mapping distance parameters of 20, 40, 49, 80, and 140 can be used to perform direct tone interleaving within the 320 MHz bandwidth channel. Complex constellation points are mapped to noncontiguous tones of the channels using the selected mapping distance parameter.

Figure 9:
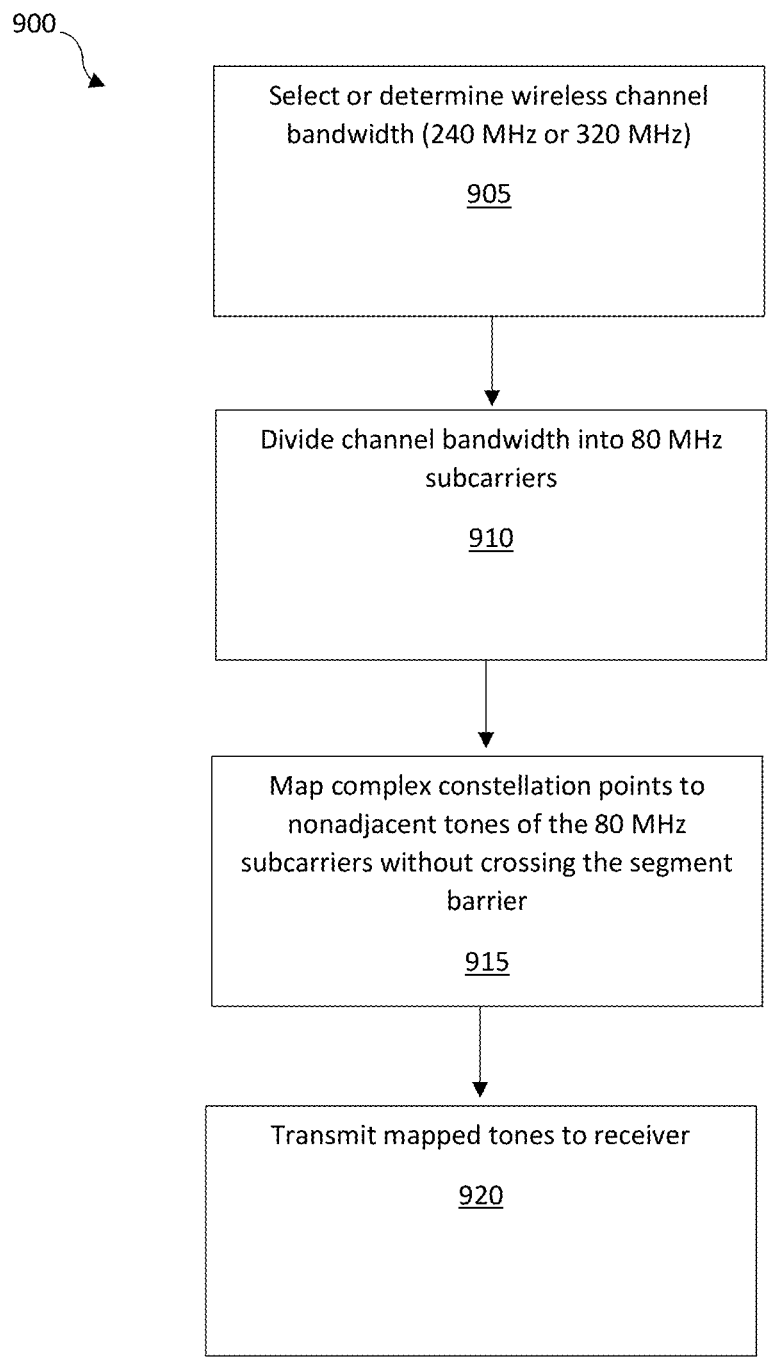
FIG. 9 is a flowchart depicting an exemplary sequence of computer implemented steps for performing tone interleaving for WLAN transmissions according to embodiments of the present invention.

With regard to FIG. 9, a flowchart 900 depicting an exemplary sequence of computer implemented steps for performing tone interleaving for WLAN transmissions is depicted according to embodiments of the present invention. The steps can be performed, for example, by a wireless device (e.g., a wireless access point or wireless station) in communication with multiple wireless clients over multiple bands. The bands can have wide bandwidths of 240 MHz or 320 MHz, and the bands can be segmented into 80 MHz subcarriers.

At step 905, a wireless channel bandwidth is selected or determined for communicating with one or more wireless devices. The channel bandwidth can be 240 MHz or 320 MHz. A 240 MHz bandwidth channel can include frequency segments of 80 MHz and 160 MHz (80+160 MHz) or three frequency segments of 80 MHz (80+80+80 MHz). A 320 MHz bandwidth channel can include frequency segments of 160 MHz (160+160 MHz), 80 MHz and 240 MHz (80+240 MHz), 80 MHz and 160 MHz (80+160 MHz), and four frequency segments of 80 MHz (80+80+80+80 MHz).

At step 910, the wide band of 240 MHz or 320 MHz is divided into 80 MHz subcarriers. 240 MHz bandwidth channels are divided into three 80 MHz subcarriers, and 320 MHz bandwidth channels are divided into four 80 MHz subcarriers.

At step 915, complex constellation points of codewords to be transmitted are mapped to nonadjacent addresses or index values of the 80 MHz subcarriers without interleaving over the segment barrier between the subcarriers. Each consecutive complex constellation point is mapped using a tone mapping distance parameter $D_{TM}$ of 20. For example, step 915 can include performing a non-linear mapping of complex constellation points to all data tones of a one subcarrier before performing a non-linear mapping of complex constellation points to all data tones of the next subcarrier until all subcarriers have been mapped.

At step 920, a wireless transmission (e.g., WLAN transmission) including the tones mapped to the complex constellation points of the codewords is transmitted to a wireless receiver.

Figure 10:
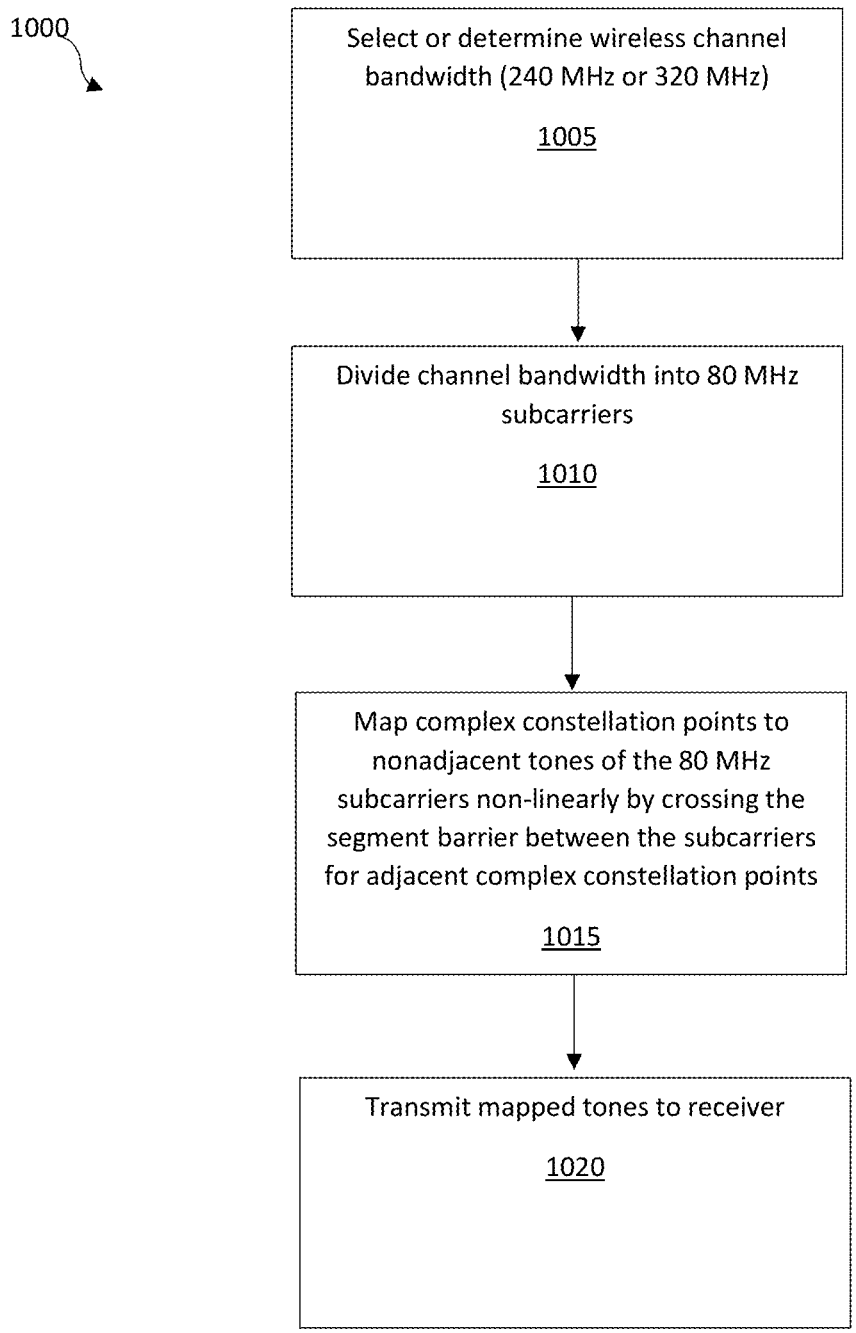
FIG. 10 is a flowchart depicting an exemplary sequence of computer implemented steps for performing two-level tone interleaving for WLAN transmissions according to embodiments of the present invention.

With regard to FIG. 10, a flowchart 1000 depicting an exemplary sequence of computer implemented steps for performing two-level tone interleaving for WLAN transmissions is depicted according to embodiments of the present invention. The steps can be performed, for example, by a wireless device (e.g., a wireless access point or wireless station) in communication with multiple wireless clients over multiple bands. The bands can be wide bands of 240 MHz or 320 MHz, and the wide bands can be segmented into 80 MHz subcarriers.

At step 1005, a wireless channel bandwidth is selected or determined. The channel bandwidth can be 240 MHz or 320 Mhz. A 240 MHz bandwidth channel can include frequency segments of 80 MHz and 160 MHz (80+160 MHz) or three frequency segments of 80 MHz (80+80+80 MHz). A 320 MHz bandwidth channel can include frequency segments of 160 MHz (160+160 MHz), 80 MHz and 240 MHz (80+240 MHz), 80 MHz and 160 MHz (80+160 MHz), and four frequency segments of 80 MHz (80+80+80+80 MHz).

At step 1010, the wide band of 240 MHz or 320 MHz is divided into 80 MHz subcarriers. 240 MHz bandwidth channels are divided into three 80 MHz subcarriers, and 320 MHz bandwidth channels are divided into four 80 MHz subcarriers.

At step 1015, complex constellation points of codewords to be transmitted are mapped to nonadjacent addresses or index values of the 80 MHz subcarriers non-linearly by crossing the segment barrier between the subcarriers for adjacent complex constellation points.

At step 1015, for a 320 MHz bandwidth channel, the tones are interleaved over four 80 MHz subcarriers according to a data tone index as 4n for the first subcarrier, 4n+1 for the second sub carrier, 4n+2 for the third subcarrier, and 4n+3 for the fourth subcarrier, where n=0, 1, 2, ..., 979, so that the complex constellation points are mapped to 980 individual tones for each subcarrier. For each complex constellation point, an address/index value of a tone within the respective subcarrier is selected, and the tones are mapped in a non-linear manner for each subcarrier.

At step 1015, for a 240 MHz bandwidth channel, the tones are interleaved over three 80 MHz subcarriers as 3n for the first subcarrier, 3n+1 for the second sub carrier, 3n+2 for the third subcarrier, and 3n+3 for the fourth subcarrier, where n=0, 1, 2, ..., 979, so that the complex constellation points are mapped to 980 individual tones for each subcarrier. For each complex constellation point, an address/index value within the respective subcarrier is selected, and the tones are mapped in a non-linear manner for each subcarrier until all data tones of the subcarriers have been mapped to complex constellation points.

At step 1020, a wireless transmission (e.g., WLAN transmission) including the tones mapped to the complex constellation points of the codewords is transmitted to a wireless receiver.

Exemplary Computer Controlled System

Embodiments of the present invention provide a method and apparatus for tone interleaving wide channel bandwidths or transmissions using multiple-bands and designed to accommodate new generations of WLAN. For example, some embodiments of the present invention use an 80 MHz channel bandwidth with resource units having 996 tones as a building block to efficiently implement new tone mapping and interleaving schemes for wide bandwidth channels, e.g., 240 MHz or 320 MHz. The following discussion describes one such exemplary electronic system or computer system can be used as a platform for implementing embodiments of the present invention as a wireless access point or wireless station.

Figure 11:
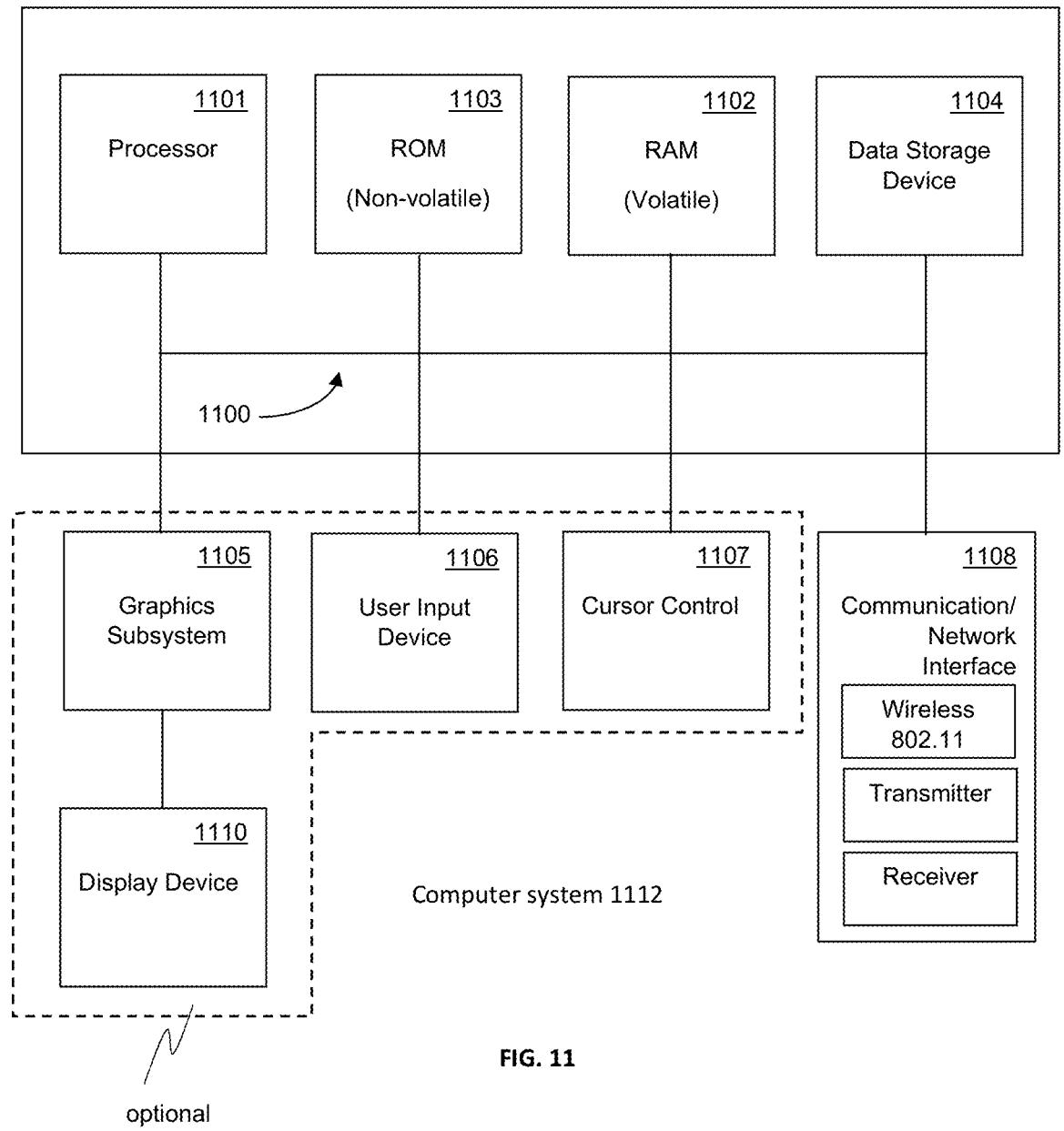
FIG. 11 depicts an exemplary computer system platform upon which embodiments of the present invention may be implemented.

In the example of FIG. 11, the exemplary computer system 1112 (e.g., a wireless access point or a wireless station) includes a central processing unit (CPU) 1101 for running software applications and optionally an operating system. Random access memory 1102 and read-only memory 1103 store applications and data for use by the CPU 1001. Data storage device 1104 provides non-volatile storage for applications and data and may include fixed disk drives, removable disk drives, flash memory devices, and CD-ROM, DVD-ROM or other optical storage devices. The optional user inputs 1106 and 1107 comprise devices that communicate inputs from one or more users to the computer system 1112 (e.g., mice, joysticks, cameras, touch screens, and/or microphones).

A communication or network interface 1108 includes a plurality of transceivers and allows the computer system 1112 to communicate with other computer systems, networks, or devices via an electronic communications network, including wired and/or wireless communication and including an Intranet or the Internet (e.g., 802.11 wireless standard). The communication or network interface 1108 and can include a transmitter and a separate receiver for sending and receiving wireless data.

The optional display device 1110 may be any device capable of displaying visual information in response to a signal from the computer system 1112 and may include a flat panel touch sensitive display, for example. The components of the computer system 1112, including the CPU 1101, memory 1102/1103, data storage 1104, user input devices 1106, and graphics subsystem 1105 may be coupled via one or more data buses 1100.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Embodiments of the present invention are thus described. While the present invention has been described in particular embodiments, it should be appreciated that the present invention should not be construed as limited by such embodiments, but rather construed according to the following claims.

What is claimed is:

1. A method of tone mapping for WLAN transmissions, the method comprising:
   determining a wireless channel bandwidth of a wireless channel to be 240 MHz, wherein the wireless channel comprises 2940 data tones, the wireless channel is operable to carry WLAN transmissions comprising codewords, and the codewords comprise a plurality of complex constellation points;
   dividing the wireless channel into three 80 MHz frequency segments with 980 data tones in each 80 MHz frequency segment;
   mapping each complex constellation point of the codewords of the WLAN transmissions to tones within each 80 MHz frequency segment, wherein consecutive complex constellation points of codewords are mapped to interleaved tones until all tones have been mapped; and
   transmitting the tones as mapped using at least one of the 80 MHz frequency segment for receipt by a receiving device.

2. The method as described in claim 1, wherein said mapping further comprises mapping each complex constellation point using a tone mapping distance parameter of 20.

3. The method as described in claim 1, wherein said mapping is performed according to an IEEE 802.11ax tone plan.

4. The method as described in claim 1, wherein said dividing and said mapping are performed by a wireless access point.

5. The method as described in claim 1, wherein said dividing and said mapping are performed by a wireless station.

6. The method as described in claim 1, further comprising transmitting the WLAN transmissions using tones that are mapped to the complex constellation points.

7. An apparatus for tone mapping of WLAN transmissions, the apparatus comprising:
   a processor; and
   a transceiver coupled to the processor, wherein the processor is operable to:
      determine a wireless channel bandwidth of a wireless channel to be 240 MHz, wherein the wireless channel comprises 2940 data tones, the wireless channel is operable to carry WLAN transmissions comprising codewords, and the codewords comprise a plurality of complex constellation points;
   divide the wireless channel into three 80 MHz frequency segments with 980 data tones in each 80 MHz frequency segment;
   map each complex constellation point of the codewords of the WLAN transmissions to tones within each 80 MHz frequency segment, wherein consecutive complex constellation points of codewords are mapped to interleaved tones until all tones have been mapped; and
   cause the transceiver to transmit the tones as mapped using at least one of the 80 MHz frequency segment for receipt by a receiving device.

\* \* \* \* \*